United States Patent
Zhang

(10) Patent No.: US 9,027,403 B2
(45) Date of Patent: May 12, 2015

(54) WIDE G RANGE ACCELEROMETER

(71) Applicant: Analog Devices, Inc., Norwood, MA (US)

(72) Inventor: Jianglong Zhang, Vienna, VA (US)

(73) Assignee: Analog Devices, Inc., Norwood, MA (US)

( * ) Notice: Subject to any disclaimer, the term of this patent is extended or adjusted under 35 U.S.C. 154(b) by 191 days.

(21) Appl. No.: 13/856,082

(22) Filed: Apr. 3, 2013

(65) Prior Publication Data

US 2013/0263663 A1 Oct. 10, 2013

Related U.S. Application Data

(60) Provisional application No. 61/620,112, filed on Apr. 4, 2012.

(51) Int. Cl.
*G01P 15/125* (2006.01)
*B81B 7/02* (2006.01)
*G01P 15/00* (2006.01)

(52) U.S. Cl.
CPC . *B81B 7/02* (2013.01); *G01P 15/00* (2013.01); *G01P 15/125* (2013.01)

(58) Field of Classification Search
USPC ....................................................... 73/504.12
See application file for complete search history.

(56) References Cited

U.S. PATENT DOCUMENTS

| 4,932,259 A | 6/1990 | Ueno ........................ 73/517 AV |
| 4,987,779 A | 1/1991 | McBrien ..................... 73/517 B |
| 5,006,487 A | 4/1991 | Stokes .......................... 437/228 |
| 5,134,881 A | 8/1992 | Henrion et al. ............. 73/517 R |
| 5,345,824 A | 9/1994 | Sherman et al. ............ 73/517 B |
| 5,352,918 A | 10/1994 | Thomas et al. ................ 257/417 |
| 5,364,497 A * | 11/1994 | Chau et al. ....................... 216/39 |
| 5,383,364 A | 1/1995 | Takahashi et al. .......... 73/517 R |
| 5,440,939 A | 8/1995 | Barny et al. ................. 73/862.61 |

(Continued)

FOREIGN PATENT DOCUMENTS

| DE | 195 37 546 A1 | 4/1997 | ............. B60R 21/32 |
| EP | 1 083 144 A1 | 3/2001 | ................ B81B 5/00 |

(Continued)

OTHER PUBLICATIONS

Ahmed et al., "A Two-Dimensional Micromachined Accelerometer," *IEEE T. Instrum. Meas.*, vol. 46, No. 1, pp. 18-26 (Feb. 1997).

(Continued)

*Primary Examiner* — Laura Martin
*Assistant Examiner* — Samir M Shah
(74) *Attorney, Agent, or Firm* — Sunstein Kann Murphy & Timbers LLP

(57) ABSTRACT

A MEMS device includes a substrate, a mass having a first and second set of elongated mass fingers extending from the mass, and a support structure supporting the mass on the substrate. The support structure may include at least one anchor and a plurality of springs that allow movement of the mass relative to the substrate. The MEMS device may also include a first set of sensing fingers for sensing movement of the first set of mass fingers relative to the first set of sensing fingers, and a second set of sensing figures for sensing movement of the second set of mass fingers relative to the second set of sensing fingers. The first and second sets of sensing fingers may have different size finger gaps between the sensing fingers and the respective mass fingers.

21 Claims, 5 Drawing Sheets

(56) References Cited

U.S. PATENT DOCUMENTS

| | | | | |
|---|---|---|---|---|
| 5,441,300 | A | 8/1995 | Yokota et al. | 280/735 |
| 5,487,305 | A | 1/1996 | Ristic et al. | 73/514.32 |
| 5,511,420 | A | 4/1996 | Zhao et al. | 73/514.18 |
| 5,565,625 | A * | 10/1996 | Howe et al. | 73/514.16 |
| 5,574,222 | A | 11/1996 | Offenberg | 73/514.32 |
| 5,587,518 | A | 12/1996 | Stevenson et al. | 73/1 D |
| 5,748,004 | A | 5/1998 | Kelly et al. | 324/661 |
| 5,780,740 | A | 7/1998 | Lee et al. | 73/504.12 |
| 5,939,633 | A | 8/1999 | Judy | 73/514.32 |
| 6,070,464 | A | 6/2000 | Koury, Jr. et al. | 73/514.32 |
| 6,158,280 | A | 12/2000 | Nonomura et al. | 73/504.04 |
| 6,223,598 | B1 * | 5/2001 | Judy | 73/514.32 |
| 6,308,569 | B1 | 10/2001 | Stewart | 73/514.32 |
| 6,370,954 | B1 * | 4/2002 | Zerbini et al. | 73/514.01 |
| 6,513,380 | B2 | 2/2003 | Reeds, III et al. | 73/504.12 |
| 6,538,233 | B1 * | 3/2003 | Lee et al. | 219/121.85 |
| 6,591,678 | B2 | 7/2003 | Sakai | 73/514.36 |
| 6,744,173 | B2 * | 6/2004 | Behin et al. | 310/309 |
| 6,847,661 | B2 * | 1/2005 | Jerman et al. | 372/20 |
| 6,868,726 | B2 * | 3/2005 | Lemkin et al. | 73/514.32 |
| 6,877,374 | B2 * | 4/2005 | Geen | 73/504.14 |
| 6,892,576 | B2 * | 5/2005 | Samuels et al. | 73/514.32 |
| 7,051,590 | B1 * | 5/2006 | Lemkin et al. | 73/504.04 |
| 7,093,478 | B2 * | 8/2006 | Chau et al. | 73/1.38 |
| 7,412,887 | B2 * | 8/2008 | Memishian | 73/514.32 |
| 7,478,557 | B2 * | 1/2009 | Geen | 73/504.14 |
| 7,505,245 | B2 * | 3/2009 | Yokoyama | 361/277 |
| 7,543,473 | B2 * | 6/2009 | Samuels | 73/1.37 |
| 8,146,425 | B2 | 4/2012 | Zhang et al. | 73/514.32 |
| 8,656,778 | B2 * | 2/2014 | Guo et al. | 73/514.32 |
| 2002/0059829 | A1 | 5/2002 | Sakai | 73/504.12 |
| 2002/0189355 | A1 | 12/2002 | Leonardson | 73/514.32 |
| 2005/0126287 | A1 * | 6/2005 | Malametz | 73/504.12 |
| 2008/0196499 | A1 * | 8/2008 | Li et al. | 73/510 |
| 2009/0309613 | A1 * | 12/2009 | Hollocher et al. | 324/661 |
| 2010/0043551 | A1 * | 2/2010 | Geen et al. | 73/514.15 |
| 2010/0242600 | A1 * | 9/2010 | Lin et al. | 73/504.12 |
| 2010/0242603 | A1 * | 9/2010 | Miller et al. | 73/514.32 |
| 2010/0251800 | A1 * | 10/2010 | Mueck | 73/1.38 |
| 2011/0023606 | A1 * | 2/2011 | Burghardt et al. | 73/514.32 |
| 2011/0030473 | A1 * | 2/2011 | Acar | 73/504.12 |
| 2011/0041609 | A1 * | 2/2011 | Clark et al. | 73/514.29 |
| 2011/0167891 | A1 * | 7/2011 | Geen | 73/1.38 |
| 2012/0116707 | A1 * | 5/2012 | Malvern | 702/104 |
| 2012/0167681 | A1 * | 7/2012 | Reinmuth | 73/504.12 |
| 2012/0228725 | A1 * | 9/2012 | Zhang et al. | 257/415 |
| 2013/0278081 | A1 * | 10/2013 | Chien | 307/121 |

FOREIGN PATENT DOCUMENTS

| | | | | |
|---|---|---|---|---|
| EP | 1 083 430 A1 | 3/2001 | | G01P 15/10 |
| WO | WO 2008/086530 A2 | 7/2008 | | B81B 7/00 |

OTHER PUBLICATIONS

Analog Devices, Precision ± 1.7 g Single/Dual Axis Accelerometer, ADXL103/ADXL203, Rev.0 (Initial Version), 12 pages (2004).

Lemkin et al., "A 3-Axis Force Balanced Accelerometer Using a Single Proof-Mass," *Transducers, 1997 International Conference on Solid-State Sensors and Actuators*, Chicago, IL, 4 pages (Jun. 1994).

Spangler et. al, "Isaac—Integrated Silicon Automotive, Accelerometer," *Transducers*, Eurosensors IX, 4 pages (1995).

* cited by examiner

WIDE G RANGE ACCELEROMETER

PRIORITY

This patent application claims priority from U.S. Provisional Patent Application No. 61/620,112, filed Apr. 4, 2012, entitled, "Wide G Range Accelerometer," and naming Jianglong Zhang as inventor, the disclosure of which is incorporated herein, in its entirety, by reference.

TECHNICAL FIELD

The present invention relates to accelerometers, and more particularly to accelerometers having a wide G detection range.

BACKGROUND ART

Microelectromechanical systems ("MEMS") are used in a growing number of applications. For example, MEMS are currently implemented as gyroscopes to detect pitch angles of airplanes, and as accelerometers to selectively deploy air bags in automobiles. In simplified terms, many such MEMS devices often have a structure suspended above a substrate, and associated circuitry that both senses movement of the suspended structure and delivers the sensed movement data to one or more external devices (e.g., an external computer). The external device processes the sensed data to calculate the property being measured (e.g., pitch angle or acceleration).

Current accelerometers most typically are available in either a low G design that is optimized to sense low G acceleration, or a high G design that is optimized to sense high G acceleration. Due to the sensitivity and accuracy required, the low G accelerometers are typically designed to have a high resolution (e.g., 0.5 mg/LSB or lower), low noise (1 mg or lower), and excellent offset stability (<70 mg for the life of the product). Conversely, because high G accelerometers need to operate over a large range, they are typically designed to have a large detection range (e.g., up to 480G—far larger than low G accelerometers, such as 8 g or 16 g), and excellent overload performance (e.g., up to 1000 g for velocity preservation).

Prior art accelerometers have been unable to combine both low G and high G performance into a single accelerometer because of the inherent differences in design and performance requirements. For example, the high overload performance required for the high G accelerometer negatively impacts the high resolution required for the low G accelerometer.

SUMMARY OF THE EMBODIMENTS

In a first embodiment of the invention, a MEMS device has a substrate, a mass having a main body, and a support structure for supporting the mass on the substrate and allowing movement of the mass relative to the substrate. The mass has a first and second set of elongated mass fingers extending from the main body.

The MEMs device may also include (1) a first set of sensing fingers for sensing movement of the first set of mass fingers relative to the first set of sensing fingers, and (2) a second set of sensing fingers for sensing movement of the second set of mass fingers relative to the second set of sensing fingers. The first set of sensing fingers may have a first finger gap between the first set of sensing fingers and the first set of elongated mass fingers. The second set of sensing fingers may have a second finger gap between the second set of sensing fingers and the second set of elongated mass fingers. The second finger gap may be larger than the first finger gap when the mass is in a steady state. The first and second sets of sensing fingers may be stationary relative to the substrate.

In accordance with additional embodiments, the first set of sensing fingers and first set of mass fingers may be configured to detect low G acceleration, and the second set of sensing fingers and the second set of mass fingers may be configured to detect high G acceleration. The first gap may be between 0.5 and 2.0 microns, and the second gap may be between 1 and 3 microns. For example, the first gap may be 1.6 microns and the second gap may be 2.4 microns.

In further embodiments, the mass may also include a third and fourth set of elongated mass fingers that extend from the main body. The MEMS device may also include a third set of sensing fingers for sensing movement of the third set of mass fingers relative to the third set of sensing fingers, and a fourth set of sensing fingers for sensing movement of the fourth set of mass fingers relative to the fourth set of sensing fingers. The third set of sensing fingers may have a third finger gap between the third set of sensing fingers and the third set of elongated mass fingers. The fourth set of sensing fingers may have a fourth finger gap between the fourth set of sensing fingers and the fourth set of elongated mass fingers. The fourth finger gap may be larger than the third finger gap.

In some embodiments, the first and third fingers gaps may be the same, and the second and fourth fingers gaps may be the same. The first and second set of sensing fingers may sense movement (e.g., acceleration) along a first axis, and the third and fourth set of elongated sensing fingers may sense movement along a second axis. The support structure may include at least one anchor and a plurality of springs extending from the anchor to the mass.

In additional embodiments, the MEMS device may also include a first conductive layer located below the mass, and a second conductive layer located above the mass. The first conductive layer may have a positive high G electrode and a positive low G electrode. The second conductive layer may have a negative high G electrode and a negative low G electrode. The positive high G electrode and negative high G electrode may have a first electrode gap between the high G electrodes and the mass. The positive low G electrode and negative low G electrode may have a second electrode gap between the low G electrodes and the mass. The first electrode gap may be larger than the second electrode gap.

Additionally or alternatively, the mass may have a positive high G electrode and a positive low G electrode on a bottom surface of the mass, and a negative high G electrode and a negative low G electrode on a top surface of the mass. The positive high G electrode and negative high G electrode may have a first electrode gap between the high G electrodes and the first and second conductive layers. The positive low G electrode and negative low G electrode may have a second electrode gap between the low G electrodes and the first and second conductive layers. The first electrode gap may be larger than the second electrode gap.

In accordance with further embodiments, a method may include providing a MEMS device having a main body, and a first and second set of elongated mass fingers extending from the main body. The MEMS device may also include a support structure, a first set of sensing fingers and a second set of sensing fingers. The support structure may support the mass on the substrate, and allow movement of the mass relative to the substrate. The first set of sensing fingers may sense movement of the first set of mass fingers relative to the first set of sensing fingers, and may have a first finger gap between the first set of sensing fingers and the first set of mass fingers. The second set of sensing fingers may sense movement of the second set of mass fingers relative to the second set of sensing fingers, and have a second finger gap between the second set of sensing fingers and the second set of elongated mass fingers. The second finger gap may be larger than the first finger gap when the mass is in a steady state, and the first and second sets of sensing fingers may be stationary relative to the substrate. For example, the first gap may be between 0.5 and 2.0 microns, and the second gap may be between 1 and 3 microns The method may also include applying a voltage to the first and/or second set of sensing fingers, and measuring a change in capacitance between the first and/or second set of elongated mass fingers and the set of sensing figures (e.g., the first and/or second set) to which the voltage is applied. Based on the measured change in capacitance, the method may determine an acceleration. Applying the voltage to the first and/or second set of sensing fingers may include applying a voltage to the first set of sensing figures for low G applications, and applying a voltage to the second set of sensing fingers for high G applications.

In some embodiments, the mass may also include a third and fourth set of elongated mass fingers that extend from the main body. In such embodiments, the MEMS device may also include a third and fourth set of sensing fingers. The third set of sensing fingers may sense movement of the third set of mass fingers relative to the third set of sensing fingers, and may have a third finger gap between the third set of sensing fingers and the third set of elongated mass fingers. The fourth set of sensing fingers may sense movement of the fourth set of mass fingers relative to the fourth set of sensing fingers, and may have a fourth finger gap between the fourth set of sensing fingers and the fourth set of elongated mass fingers. The fourth finger gap may be larger than the third finger gap. Additionally, applying a voltage to the first set of sensing fingers may include applying the voltage to the third set of sensing fingers, and applying a voltage to the second set of sensing fingers may include applying the voltage to the fourth set of sensing fingers.

In accordance with additional embodiments a MEMS device may include a substrate and a mass having a main body with a first and second cavity. The mass may also have (1) a first set of elongated mass fingers extending from an inner wall of the main body and into the first cavity, and (2) a second set of elongated mass fingers extending from the inner wall and into the second cavity. The MEMS device may also include a support structure that supports the mass on the substrate, and allows movement of the mass relative to the substrate. A first set of sensing fingers may sense movement of the first set of mass fingers relative to the first set of sensing fingers, and may have a first finger gap between the first set of sensing fingers and the first set of mass fingers. A second set of sensing fingers may sense movement of the second set of mass fingers relative to the second set of sensing fingers, and may have a second finger gap between the second set of sensing fingers and the second set of elongated mass fingers. The second finger gap may be larger than the first finger gap when the mass is in a steady state, and the first and second sets of sensing fingers may be stationary relative to the substrate.

In some embodiments, the first set of sensing fingers and the first set of mass fingers may be configured to detect low G acceleration, and the second set of sensing fingers and the second set of mass fingers may be configured to detect high G acceleration. The first gap may be between 0.5 and 2.0 microns, and the second gap may be between 1 and 3 microns. For example, the first gap may be 1.6 microns and the second gap may be 2.4 microns.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In illustrative embodiments, a wide G range accelerometer is able to achieve the performance of both a low G accelerometer and a high G accelerometer. For example, by utilizing multiple sets of fingers, some embodiments of the present invention are able to achieve the sensitivity and accuracy of low G accelerometers and the high detection range of high G accelerometers. Details of illustrative embodiments are discussed in greater detail below.

Figure 1:
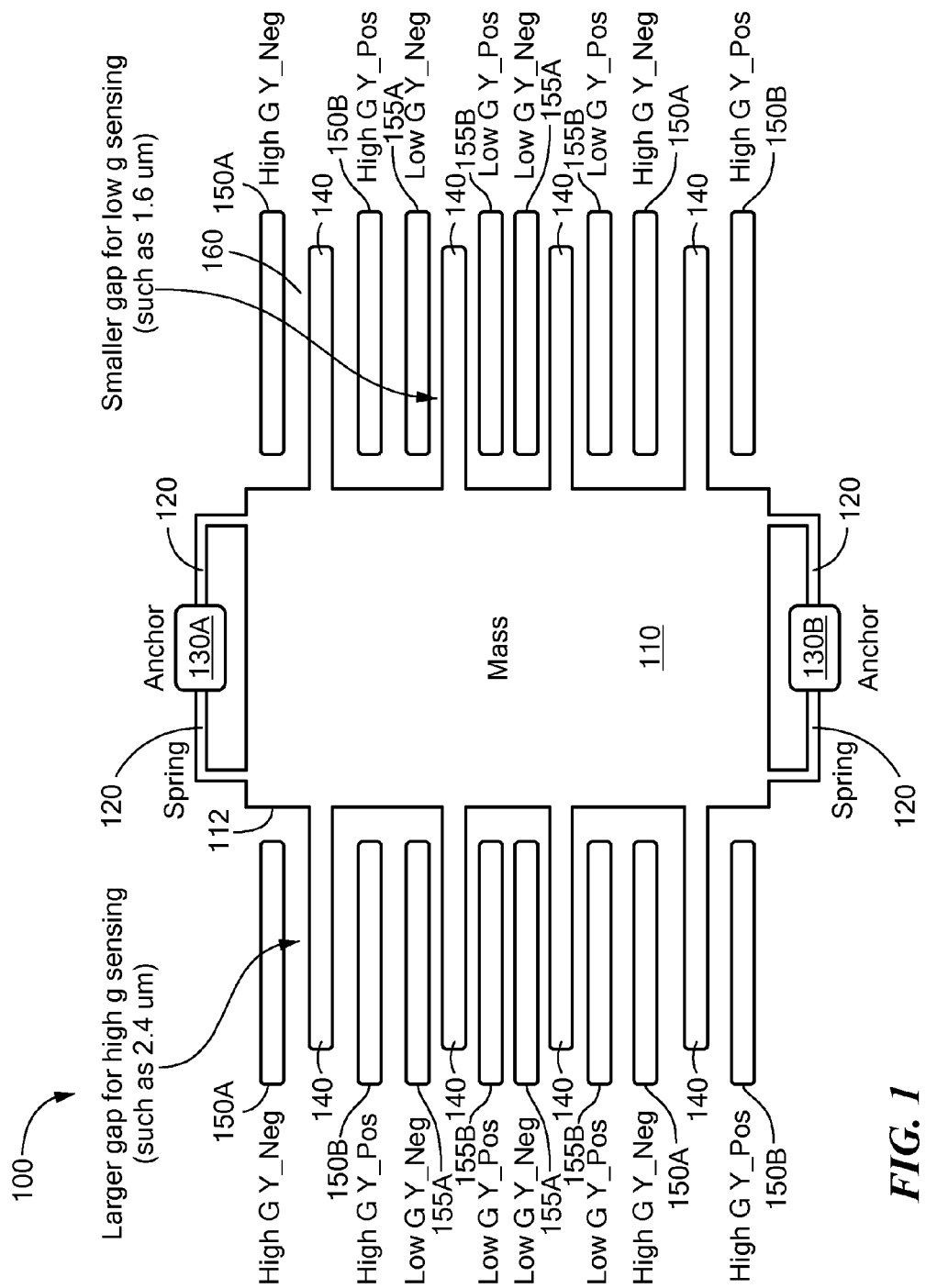
FIG. 1 schematically shows a first embodiment of a wide G range accelerometer in accordance with one embodiment of the present invention.

FIG. 1 schematically shows a wide G range accelerometer in accordance with some embodiments of the present invention. The MEMS device 100 can have a moveable mass 110 mounted to a substrate (not shown) via one or more anchors 130A/B and a plurality of springs 120 that allow the moveable mass 110 to move when a force is applied (e.g., in response to an acceleration). For example, as shown in FIG. 1, the device 100 may include a first anchor 130A located above the mass 110 (e.g., along the longitudinal axis of the mass 110 and a second anchor 130B located below the mass 110 (e.g., also along the longitudinal axis of the mass 110). The springs 120 may extend from each of the anchors 130A/B and connect to the mass 110.

In order to measure acceleration, the moveable mass 110 may have a number of mass fingers 140 (e.g., moveable fingers) that extend from the outer periphery 112 (e.g., the outer edge) of the moveable mass 110. For example, as shown in FIG. 1, the moveable fingers 140 may extend outwardly from both the left and right side of the mass 110. It is important to note that, although FIG. 1 shows four moveable fingers 140 extending from each side of the mass 110, other embodiments can have more or less moveable fingers 140. For example, some embodiments may have less than four moveable fingers 140 on each side (e.g., two or three on each side) or more than four moveable fingers 140 on each side (e.g., five, six, seven or more on each side).

Additionally, the MEMS device 100 can also have multiple sets of fixed fingers 150/155 that extend between the fingers 140 of the moveable mass 110. For example, as shown in FIG. 1, the moveable fingers 140 and sets of fixed fingers 150/155 may be interdigitated with a finger gap between the mass/ moveable fingers 140 and each of the fixed fingers 150/155. In illustrative embodiments, the first set of fingers 150, also referred to as high G fingers 150, measure acceleration during high G applications, and the second set of fingers 155, also referred to as low-G fingers 155, measure acceleration during low G applications. As discussed in greater detail below, the fixed fingers 150/155 and the moveable fingers 140 form differential capacitors in which the fixed fingers 150/155 act as stationary electrodes, and the mass/moveable fingers 140 act as moveable electrodes. As the name suggests, a stationary electrode (e.g., the fixed fingers 150/155) does not move when a force is applied (e.g., when the device is subjected to an acceleration), whereas a moveable electrode (e.g. the mass fingers 140) moves when a force is applied to the MEMS device 100 (e.g., the mass fingers 140 will move with the moveable mass 110).

Each set of the fixed fingers 150/155 can, in turn, have both positive and negative fingers. For example, as shown in FIG. 1, the fixed high G fingers can have negative high G fingers 150A that apply a negative voltage signal, and positive high G fingers 150B that apply a positive voltage signal to create an electric field. Similarly, the set of low G fingers 150 can have negative low G fingers 150A that apply a negative voltage signal, and positive low G fingers 150B that apply a positive voltage signal. As shown in FIG. 1, both the high and low G fingers 150/155 may be oriented such that the negative finger 150A/155A is located on one side of a moveable finger 140 and the positive finger 150B/155B is located on the other side of the moveable finger 140, such that the moveable finger extends between the negative finger 150A/155A and the positive finger 150B/155B.

Although the fixed fingers 150/155 may be oriented in any number of ways, as shown in FIG. 1, in some embodiments, the low G fingers 150A/B may be located between the sets of the high G fingers 155A/B. For example, if the mass 110 has four moveable fingers 140 on each side, the high G fingers 150A/150B may interdigitate with the top and bottom moveable fingers 140 (e.g., the negative high G finger 150A may be located above the top moveable finger 140 and the positive high G finger 150B may be located below the top moveable finger 140), and the low G fingers 155A/B may interdigitate with the two middle moveable fingers 140. It is also important to note that all of the positive fingers 150B/155B may be located on the same side of their respective moveable finger 140, and the negative fingers 150A/155A may be located on the opposing side such that the positive and negative fingers alternate. For example, if the top moveable finger 140 has a negative high G finger 150A above it and a positive high G finger 150B below it, then the next moveable finger 140 may have a negative low G finger 155A above it and a positive low G finger 155B below it.

When a force is applied to the MEMS device 100 (e.g., when it is subjected to a sufficiently high acceleration), the moveable mass 110 moves, causing the distance between each of the mass fingers 140 and fixed fingers 150/155 to change (e.g., each of the mass fingers 140 moves closer to the fixed fingers 150/155 on one side of the mass fingers 140 and farther away from the fixed finger 150/155 on the other side). This change in distance, in turn, changes the capacitance between the fingers (e.g., the electrodes). The supporting electronics (discussed in greater detail below) then measures this change in capacitance, and determines the acceleration based upon this change in capacitance.

To detect both high G accelerations and low G accelerations, the low G fingers 155A/B and the high G fingers 150A/B may have different finger gaps (e.g., the gaps between the fixed fingers 150/155 and the moveable/mass fingers 140). For example, the low G fingers 155A/B can have a smaller gap 170 than that of the high G fingers 150A/B (e.g., gap 160 in FIG. 1). In other words, the low G fingers 155A/B may be closer to the moveable mass fingers 140 than the high G fingers 150A/B. It is important note that the size of the gaps 160/170 are determined when the mass is in a steady state, for example, when the MEMS device is not subject to a force/acceleration and/or the springs 120 are unstressed.

By varying the gap sizes 160/170 between the fingers, various embodiments of the present invention can achieve performance comparable to those of both low G accelerometers and high G accelerometers within a single device. For example, by having a relatively small finger gap 170, the low G fingers 155A/B (in combination with the moveable fingers 140) are able to maintain the high level of sensitivity, resolution and accuracy required for measurement of low G accelerations. Additionally, because they have a larger finger gap 160, the high G fingers 150A/B (also in combination with the moveable fingers 140) have reduced sensitivity nonlinearity, and an increased detection range. Therefore, some embodiments of the present invention are essentially able to form two differential capacitors with different performance characteristics—one that includes the low G fingers 155A/B and a subset of the moveable fingers 140 and measures low G acceleration, and another that includes the high G fingers 150A/B and a different subset of the moveable fingers 140 and can measure high G acceleration.

The size of the finger gaps 160/170 and the difference in size between the low G finger gap 170 and the high G finger gap 160 can vary from application to application. In some embodiments, the high G finger gap 160 can be 1.3 to 2 times the size of the low G finger gap 170. For example, the low G finger gap 170 may be 1.6 microns and the high G finger gap 160 can be 2.4 microns (e.g., the high G finger gap 160 can be 1.5 times larger than the low G finger gap 170). In other embodiments, the low G finger gap 170 can range from 0.5 microns to 2 microns, and the high G finger gap 160 can range between 1 micron to 3 microns.

Figure 2:
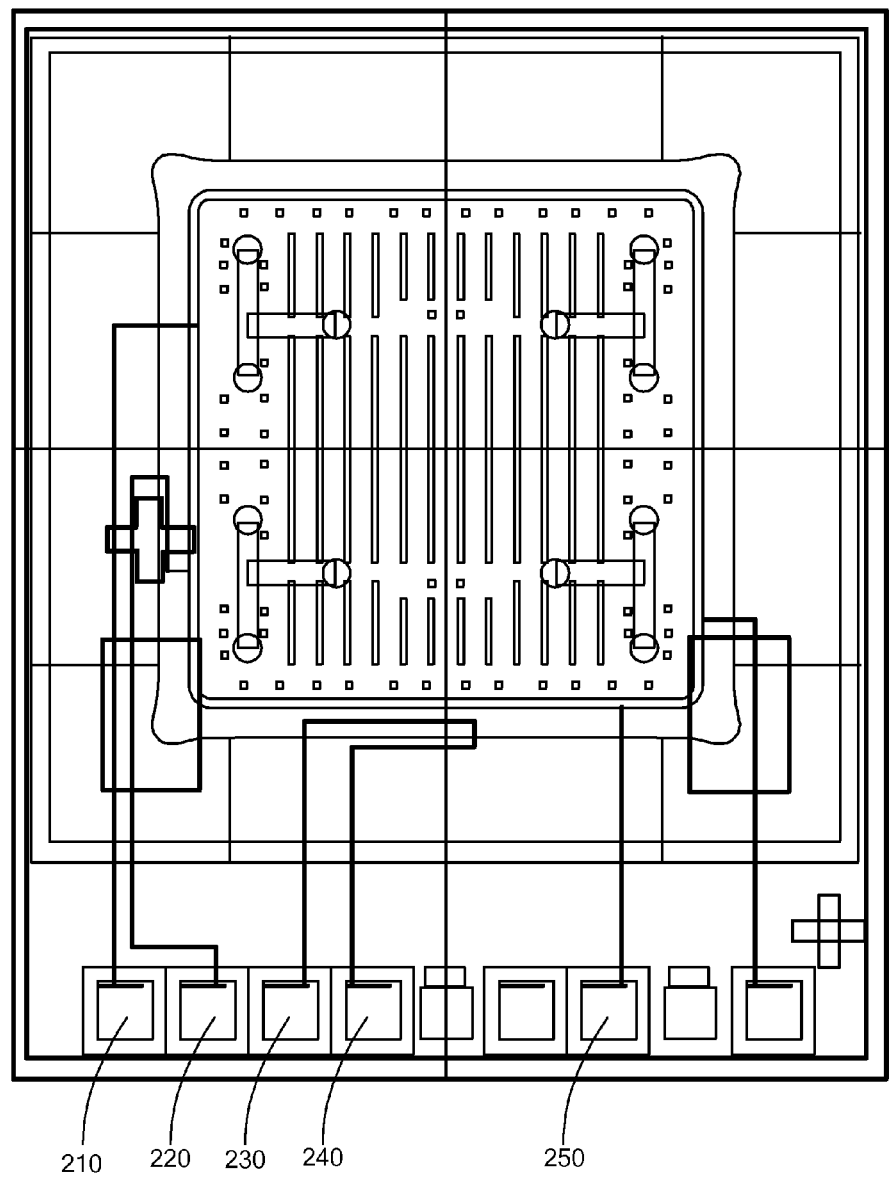
FIG. 2 schematically shows the layout of the wide G range accelerometer shown in FIG. 1, in accordance with some embodiments of the present invention.

FIG. 2 schematically shows a pad and connector layout of the wide G range accelerometer 100 shown in FIG. 1. As shown in FIG. 2, the accelerometer 100 can include and/or otherwise be connected to a number of signal generators that provide the voltage signals to each of the fixed fingers 150/155 to create the electrical field required for operation (e.g., to create and measure the change in capacitance between the fixed fingers 150/155 and the moveable fingers 140). These signal generators can be on-chip or off chip. For example, the MEMS device 100 can include a low G negative signal generator 210 that generates and applies a negative voltage signal to the negative low G fingers 155A, a low G positive signal generator 220 that generates and applies a positive voltage to the positive high G fingers 155B, a high G negative signal generator 230 that generates and applies a negative voltage signal to the negative high G fingers 150A, and a high G positive signal generator 240 that generates and applies a positive voltage signal to the positive high G fingers 150B.

During operation, if the MEMS device 100 is going to be used in a low G application, the low G negative signal generator 210 will apply a negative voltage to each of the negative low G fingers 155A, and the low G positive signal generator 220 will apply a positive voltage to each of the positive low G fingers 155B. Therefore, when a force (e.g., a low G acceleration) is applied to the MEMS device 100, the mass 110 and the moveable fingers 140 will move, changing the capacitance between the moveable fingers 140 and the low G fingers 155A/B. This change in capacitance can be measured by a signal monitor 250 (e.g., a beam node) which, in turn, can either determine the applied acceleration or forward the capacitance information to a data analysis device (not shown) that can determine the acceleration based upon the received/recorded capacitance data.

Conversely, when the MEMS device is to be used in a high G application, the high G negative signal generator 230 will apply a negative voltage to each of the negative high G fingers 150A, and the high G positive signal generator 240 will apply a positive voltage to each of the positive high G fingers 150B. In a manner similar to that described above for low G applications, when the MEMS device 100 is subject to a high G acceleration, the capacitance between the moveable fingers 140 and the high G fingers 150A/B will change (e.g., as the movable fingers 140 move). This change can then be monitored/measured by the signal monitor 250, and the acceleration determined by the signal monitor 250 and/or data analysis device.

Additionally, in some embodiments, the MEMS device 100 can be used to measure both low G accelerations and high G accelerations simultaneously. To that end, the signal generators 210/220/230/240 can apply voltages/signals to each of the fixed fingers 150/155. For example, the low G negative signal generator 210 will apply a negative voltage to each of the negative low G fingers 155A, the low G positive signal generator 220 will apply a positive voltage to each of the positive low G fingers 155B, the high G negative signal generator 230 will apply a negative voltage to each of the negative high G fingers 150A, and the high G positive signal generator 240 will apply a positive voltage to each of the positive high G fingers 150B. In such embodiments, the MEMS device can detect the low G acceleration with enhanced sensitivity, as well as the high G acceleration with enhanced sensitivity and reduced nonlinearity.

Figure 3:
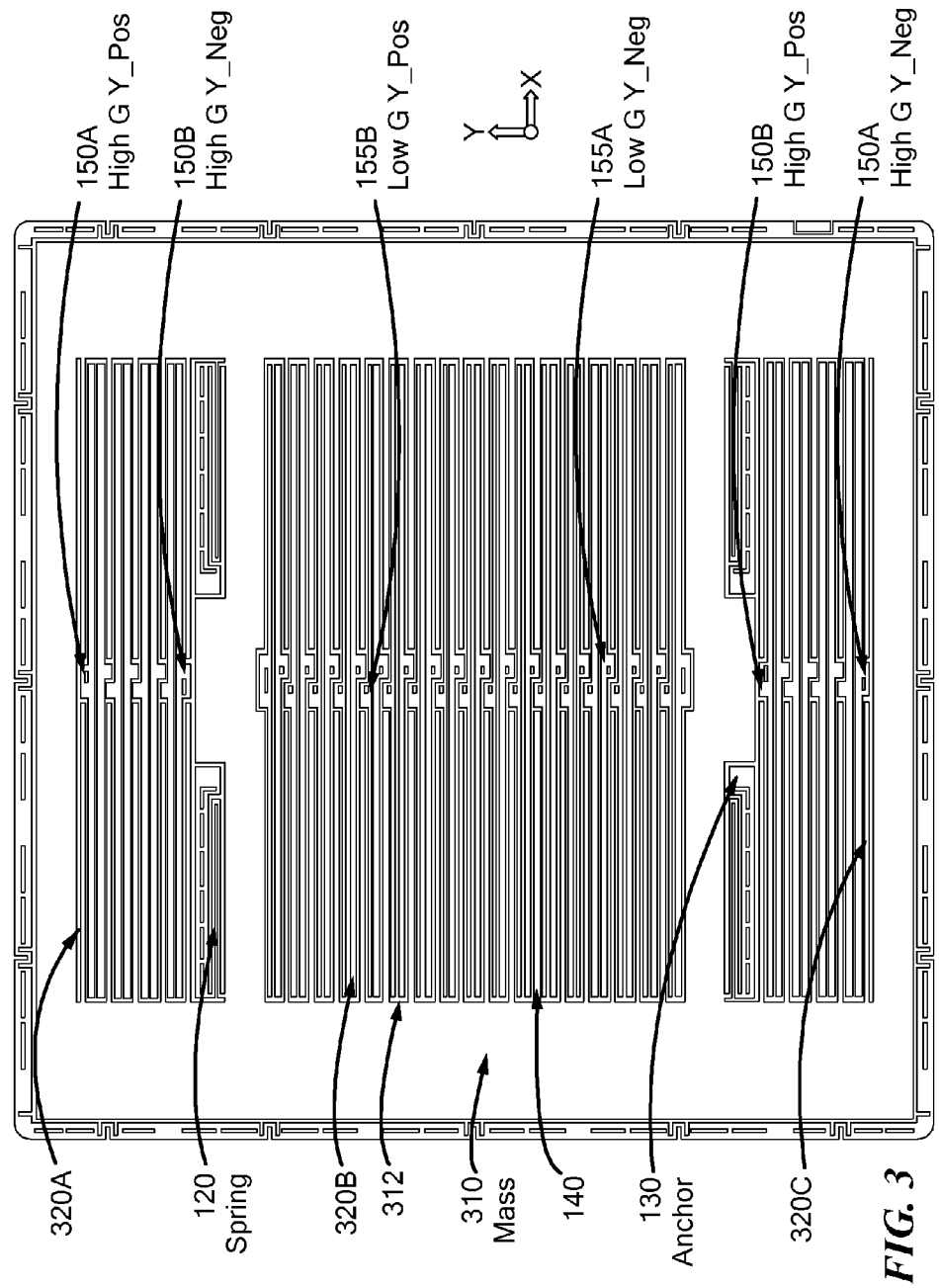
FIG. 3 schematically shows a layout view of an alternative wide G range accelerometer, in accordance with some embodiments of the present invention.

Although the above described MEMS device 100 has a mass that is located in the middle of the fixed fingers 150/155, such that the moveable fingers 140 extend outwardly from the outer surface 112 of the mass 110, other embodiments of the present invention can have different mass configurations. For example, as shown in FIG. 3, the mass 310 can have a number of cavities 320A-C and the moveable fingers 140 can extend inward into each of the cavities 320A-C from an inner wall 312 of the mass 310 (e.g., from a wall of the cavities 320A-C). In such embodiments, the fixed fingers 150/155 may extend from near the center of each cavity 320A-C towards the inner walls 312, and interdigitate with the moveable fingers 140. As shown in FIG. 3, the high G fixed fingers 150A/B can be contained within cavities 320A and 320C, and the low G fixed fingers 155A/B can be contained within cavity 320B (e.g., the low G and high G fixed fingers 150/155 may be separated, and may not alternate like that shown in FIG. 1).

Alternatively, the high G fixed fingers 150A/B can be contained within cavity 320B, and the low G fixed fingers 155A/B can be contained within cavities 320A and 320C (e.g., the low G and high G fixed fingers 150/155 may be separated, and may not alternate like that shown in FIG. 1). Furthermore, although FIG. 3 shows three cavities 320A/B/C, other embodiments may have more or less cavities. For example, in some embodiments, the mass 310 can have only one cavity with both the low G and high G fingers 150/155, two cavities (e.g., with the low G fingers 155 in one cavity and the high G fingers 150 in the other), or four (or more) cavities (e.g., with the low G fingers 155 in two cavities and the high G fingers 150 in the other two).

Figure 4:
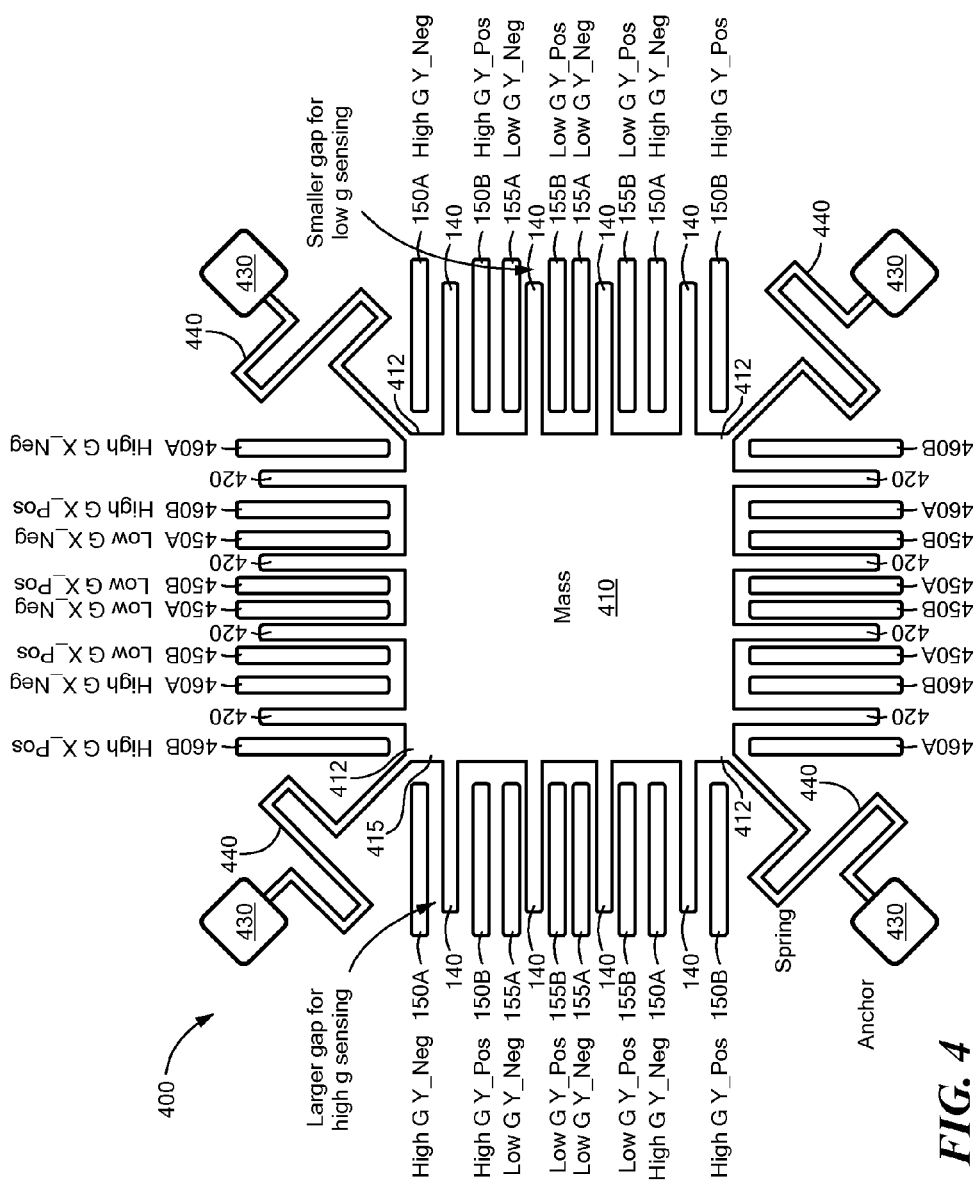
FIG. 4 schematically shows a third embodiment of a wide G range accelerometer in accordance with additional embodiments of the present invention.

Furthermore, although the accelerometer 100 shown in FIG. 1 is a single axis accelerometer (e.g., it measures acceleration along only one axis), other embodiments can measure acceleration along more than one axis. For example, as shown in FIG. 4, some embodiments of the present invention may be configured as a dual axis wide G range accelerometer 400. Like the single axis accelerometer 100, the dual axis accelerometer 400 also has a moveable mass 410 that is supported on a substrate via a plurality of anchors 430 and springs 440 (e.g., at the corners 412 of the moveable mass 410). In addition to the moveable fingers shown in FIG. 1, the moveable mass 410 within the dual axis accelerometer 400 may also have additional moveable fingers 420 extending from the mass 410 (e.g., extending outwardly from an outer surface 415 like that shown in FIG. 4 or extending inwardly into a cavity in a manner similar to that shown in FIG. 3).

Unlike the single axis embodiment that only has fingers 140 extending from two sides of the mass 110 (e.g., from the left and right side), in order to measure the acceleration along a second axis, the mass 410 within the dual axis accelerometer 400 can have fingers 140/420 extending from all sides of the mass 410 (e.g., from the left side, the right side, the top, and the bottom). Additionally, the accelerometer 400 may have two additional sets of fixed fingers that interdigitate with the moveable fingers 420 extending from the top and bottom of the mass 410. For example, the accelerometer 400 may have a set of X-axis low G fingers 450A/B and a set of X-axis high G fingers 460A/B. In such embodiments, the fingers 140 extending from the left and right side of the mass 410 can be used to measure acceleration along the Y-axis (e.g., in a manner similar to that described above for the single axis accelerometer 100), and the fingers 420 extending from the top and bottom of the mass 410 can be used to measure the acceleration along the X-axis.

During operation and measurement, the signal generators can apply the voltage in a manner similar to that described above for the single axis embodiment. For example, during low G acceleration applications, the low G negative signal generator 210 can apply a negative voltage to each of the negative low G fingers 155A/450A, and the low G positive signal generator 220 can apply a positive voltage to each of the positive low G fingers 155B/450B. Similarly, when the MEMS device is to be used in a high G application, the high G negative signal generator 230 can apply a negative voltage to each of the negative high G fingers 150A/460A, and the high G positive signal generator 240 can apply a positive voltage to each of the positive high G fingers 150B/460B. However, unlike the single axis embodiments, in the dual axis embodiments, the signal generators 210/220/230/240 will apply their respective signals to fixed fingers 150/155/450/460 along all sides of the mass 110 (e.g., to the fixed fingers that measure acceleration along the X-axis 450/460 as well as the fixed fingers that measure the acceleration along the Y-axis 150/155).

By utilizing multiple sets of fixed fingers 150/155/450/460 and signal generators 210/220/230/240, embodiments of the present invention are also able to simplify device testing by utilizing the low G fingers 155/450 to perform a self-test for high G measurements (and vice versa). For example, some embodiments are able to use the low G fingers 155/450 and the low G signal generators 210/220 to apply an electrostatic force which, in turn, causes the mass 110 to move. The high G fingers 150/460 and signal monitor 250 can then measure the change in capacitance caused by the movement of the mass 110. The measured data can then, in turn, be used to confirm that the MEMs device/accelerometer 100 is performing correctly. Also, in a similar manner, the high G fingers 150/460 can be used to perform a self-test for low G measurements.

Figure 5:
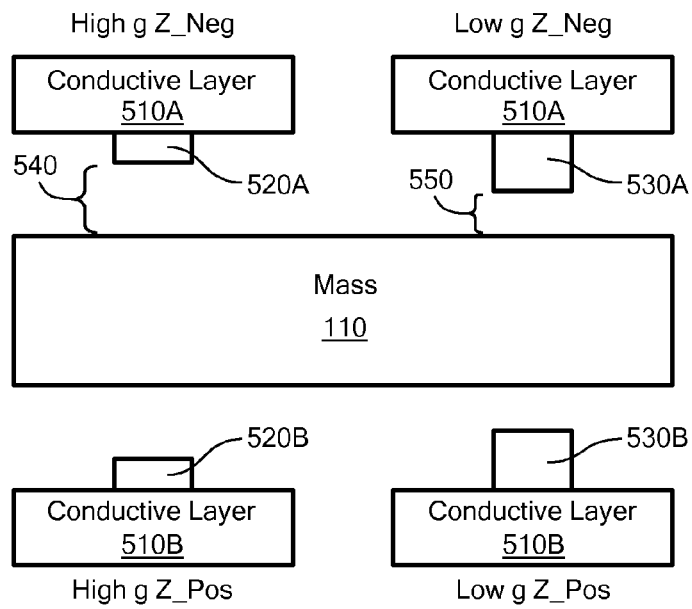
FIG. 5 schematically shows a fourth embodiment of a wide G range accelerometer in accordance with additional embodiments of the present invention.

Additionally, as shown in FIG. 5, some embodiments may also measure acceleration along a third axis (e.g., the Z-axis) in addition to the X-axis and the Y-axis. In such embodiments, in addition to the inter-digitated fingers discussed above and shown in FIGS. 1, 3, and 4, the MEMS device 100 may include conductor layers 510A/B located above and below the mass 110. Each of these conductor layers 510A/B may include a high G electrode 520A/B and a low G electrode 530A/B. For example, conductor layer 510A located above the mass 110 can include a negative high G electrode 520A and a negative low G electrode 530A. Similarly, conductor layer 510B located below the mass 110 can include a positive high G electrode 520B and a positive low G electrode 530B. Like the finger gaps discussed above, the gap 540 between the mass 110 and the high G electrodes 520A/520B may be larger than the gap 550 between the mass 110 and the low G electrodes 530A/530B. To achieve this different in the gaps sizes, the low G electrodes 530A/530B may be thicker than the high G electrodes 520A/520B.

During operation, the low G negative signal generator 210 will apply a negative voltage to the negative low G electrode 530A, the low G positive signal generator 220 will apply a positive voltage to the positive low G electrode 530B, the high G negative signal generator 230 will apply a negative voltage to the negative high G electrode 520A, and the high G positive signal generator 240 will apply a positive voltage to the positive high G electrode 520B. When a force (e.g., an acceleration) is applied to the MEMS device 100 along the Z-axis, the mass 110 will move, changing the capacitance between mass 110 and the electrodes 520A/520B/530A/530B. This change in capacitance can be measured by the signal monitor 250.

Figure 6:
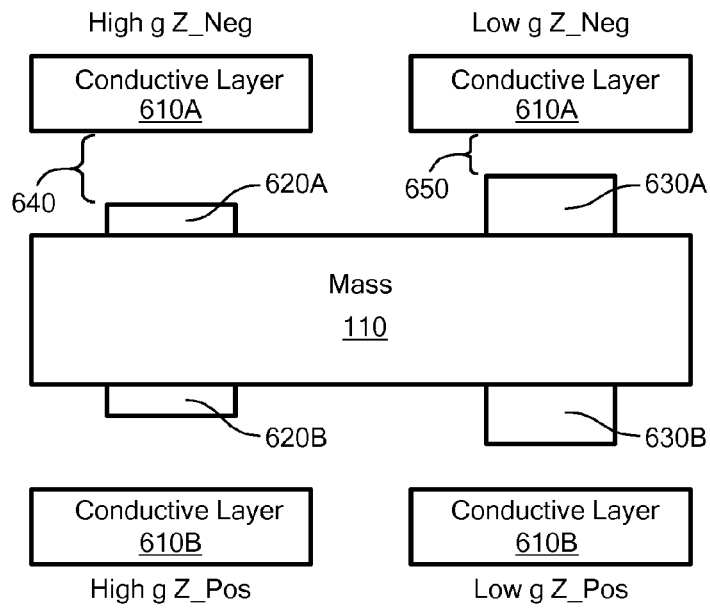
FIG. 6 schematically shows a fifth embodiments of a wide G range accelerometer in accordance with additional embodiments of the present invention.

FIG. 6 shows an alternative embodiment for measuring acceleration along the Z-axis. In such embodiments, the electrodes may be located on the mass 110 instead of the conductive layers. For example, in addition to the moveable fingers discussed above and shown in FIGS. 1, 3, and 4, the mass 110 may include a negative high G electrode 620A and a negative low G electrode 630A on the top surface of the mass 110. Similarly, the mass 110 may include positive high G electrode 620B and a positive low G electrode 630B located on the bottom surface of the mass 110. Like the finger gaps discussed above, the gap 640 between the conductive layers 610A/610B and the high G electrodes 620A/620B may be larger than the gap 650 between the conductive layers 610A/610B and the low G electrodes 630A/630B. Like the embodiment shown in FIG. 5, to achieve this difference in the gap sizes, the low G electrodes 630A/630B may be thicker than the high G electrodes 620A/620B.

It is important to note that by combining the performance of a low G accelerator and a high G accelerometer into a single MEMS device, various embodiments of the present invention are able to reduce the cost and complexity of systems requiring detection of both low G and high G accelerations. For example, instead of requiring two (or more) separate accelerometers (e.g., one to measure low G acceleration and one to measure high G acceleration), systems utilizing the above described embodiments only require a single device (e.g., because both high and low G accelerations can be measured with a single device). This, in turn, also further reduces production cost because it reduces the die size required to form the accelerometer(s) (e.g., because the die does not need to contain two accelerometers).

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A MEMS device comprising:
   a substrate;
   a mass having a main body, a first set of elongated mass fingers, and a second set of elongated mass fingers, the first and second sets of elongated mass fingers extending from the main body;
   a support structure supporting the mass on the substrate, the support structure allowing movement of the mass relative to the substrate;
   a first set of sensing fingers for sensing movement of the first set of mass fingers relative to the first set of sensing fingers, the first set of sensing fingers having a first finger gap between the first set of sensing fingers and the first set of mass fingers; and
   a second set of sensing fingers for sensing movement of the second set of mass fingers relative to the second set of sensing fingers, the second set of sensing fingers having a second finger gap between the second set of sensing fingers and the second set of elongated mass fingers, the second finger gap being larger than the first finger gap when the mass is in a steady state, the first and second sets of sensing fingers being stationary relative to the substrate.

2. A MEMS device according to claim 1, wherein the first set of sensing fingers and first set of mass fingers are configured to detect low G acceleration.

3. A MEMS device according to claim 1, wherein the second set of sensing fingers and the second set of mass fingers are configured to detect high G acceleration.

4. A MEMS device according to claim 1 wherein the first gap is between 0.5 and 2.0 microns, and the second gap is between 1 and 3 microns.

5. A MEMS device according to claim 4, wherein the first gap is 1.6 microns and the second gap is 2.4 microns.

6. A MEMS device according to claim 1, wherein the mass further includes a third set of elongated mass fingers, and a fourth set of elongated mass fingers, the third and fourth set of elongated mass fingers extending from the main body.

7. A MEMS device according to claim 6, further comprising:
   a third set of sensing fingers for sensing movement of the third set of mass fingers relative to the third set of sensing fingers, the third set of sensing fingers having a third finger gap between the third set of sensing fingers and the third set of elongated mass fingers; and
   a fourth set of sensing fingers for sensing movement of the fourth set of mass fingers relative to the fourth set of sensing fingers, the fourth set of sensing fingers having a fourth finger gap between the fourth set of sensing fingers and the fourth set of elongated mass fingers, the fourth finger gap being larger than the third finger gap.

8. A MEMS device according to claim 7, wherein the first and third fingers gaps are the same, and the second and fourth fingers gaps are the same.

9. A MEMS device according to claim 7, wherein the first and second set of sensing fingers sense movement along a first axis.

10. A MEMS device according to claim 9, wherein the third and fourth set of sensing fingers sense movement along a second axis.

11. A MEMS device according to claim 1, wherein the support structure includes at least one anchor and a plurality of springs extending from the anchor to the mass.

12. A MEMS device according to claim 1, further comprising:
   a first conductive layer located below the mass and having a positive high G electrode and a positive low G electrode; and
   a second conductive layer located above the mass and having a negative high G electrode and a negative low G electrode,
   the positive high G electrode and negative high G electrode having a first electrode gap between the high G electrodes and the mass, the positive low G electrode and negative low G electrode having a second electrode gap between the low G electrodes and the mass, the first electrode gap being larger than the second electrode gap.

13. A method comprising:
   providing a MEMS device having:
      a main body and a first and second set of elongated mass fingers extending from the main body,
      a support structure supporting the mass on the substrate, the support structure allowing movement of the mass relative to the substrate,
      a first set of sensing fingers for sensing movement of the first set of mass fingers relative to the first set of sensing fingers, the first set of sensing fingers having a first finger gap between the first set of sensing fingers and the first set of mass fingers, and
      a second set of sensing fingers for sensing movement of the second set of mass fingers relative to the second set of sensing fingers, the second set of sensing fingers having a second finger gap between the second set of sensing fingers and the second set of elongated mass fingers, the second finger gap being larger than the first finger gap when the mass is in a steady state, the first and second sets of sensing fingers being stationary relative to the substrate;
   applying a voltage to at least one of the first and second set of sensing fingers;
   measuring a change in capacitance between at least one of the first and second set of elongated mass fingers and the at least one of the first and second set of sensing figures to which the voltage is applied; and
   determining an acceleration based upon the measured change in capacitance.

14. A method according to claim 13, wherein applying a voltage to at least one of the first and second set of sensing fingers includes applying a voltage to the first set of sensing figures for low G applications and applying a voltage to the second set of sensing fingers for high G applications.

15. A method according to claim 13, wherein the first gap is between 0.5 and 2.0 microns, and the second gap is between 1 and 3 microns 16. A method according to claim 13, wherein the mass further includes a third set of elongated mass fingers, and a fourth set of elongated mass fingers, the third and fourth set of elongated mass fingers extending from the main body.

17. A method according to claim 16, the MEMS device further comprising:
   a third set of sensing fingers for sensing movement of the third set of mass fingers relative to the third set of sensing fingers, the third set of sensing fingers having a third finger gap between the third set of sensing fingers and the third set of elongated mass fingers; and
   a fourth set of sensing fingers for sensing movement of the fourth set of mass fingers relative to the fourth set of sensing fingers, the fourth set of sensing fingers having a fourth finger gap between the fourth set of sensing fingers and the fourth set of elongated mass fingers, the fourth finger gap being larger than the third finger gap,
   wherein applying a voltage to the first set of sensing fingers includes applying the voltage to the third set of sensing fingers, and applying a voltage to the second set of sensing fingers includes applying the voltage to the fourth set of sensing fingers.

18. A MEMS device comprising:
   a substrate;
   a mass having a main body with a first and second cavity, a first set of elongated mass fingers extending from an inner wall of the main body and into the first cavity, and a second set of elongated mass fingers extending from the inner wall and into the second cavity;
   a support structure supporting the mass on the substrate, the support structure allowing movement of the mass relative to the substrate;
   a first set of sensing fingers for sensing movement of the first set of mass fingers relative to the first set of sensing fingers, the first set of sensing fingers having a first finger gap between the first set of sensing fingers and the first set of mass fingers; and
   a second set of sensing fingers for sensing movement of the second set of mass fingers relative to the second set of sensing fingers, the second set of sensing fingers having a second finger gap between the second set of sensing fingers and the second set of elongated mass fingers, the second finger gap being larger than the first finger gap when the mass is in a steady state, the first and second sets of sensing fingers being stationary relative to the substrate.

19. A MEMS device according to claim 18, wherein the first set of sensing fingers and first set of mass fingers are configured to detect low G acceleration, and the second set of sensing fingers and the second set of mass fingers are configured to detect high G acceleration.

20. A MEMS device according to claim 18, wherein the first gap is between 0.5 and 2.0 microns, and the second gap is between 1 and 3 microns.

21. A MEMS device according to claim 18, wherein the first gap is 1.6 microns and the second gap is 2.4 microns.

* * * * *